United States Patent [19]

Olsson et al.

[11] Patent Number: 4,564,946

[45] Date of Patent: Jan. 14, 1986

[54] OPTICAL COMMUNICATIONS SYSTEM USING FREQUENCY SHIFT KEYING

[75] Inventors: Nils A. Olsson, Berkeley Heights; Won-Tien Tsang, New Providence, both of N.J.

[73] Assignee: AT&T Bell Laboratories, Murray Hill, N.J.

[21] Appl. No.: 469,800

[22] Filed: Feb. 25, 1983

[51] Int. Cl.⁴ .............................................. H01S 3/19
[52] U.S. Cl. ...................................... 372/20; 372/26; 372/44; 372/50
[58] Field of Search ....................... 372/44, 50, 20, 28; 455/611, 613; 332/7.51

[56] References Cited

PUBLICATIONS

Chang et al., "Amplification in Cleaved-Substrate Lasers" *IEEE Journal of Quantum Electronics,* vol. QE-16, No. 9, Sep. 1980, pp. 997-1001.
Allen et al., "Single Frequency Injection Laser Diodes for Integrated Optics and Fiber Optics Applications", SPIE vol. 157, 1978, pp. 110-117.
S. Saito et al., "Optical FSK Heterodyne Detection Experiments Using Semiconductor Laser Transmitter and Local Oscillator," *IEEE Journal of Quantum Electronics,* vol. QE-17, No. 6, Jun. 1981, pp. 935-941.
S. M. A. Hamdy et al., "Comparison of Modal Analysis and Equivalent Circuit Representation of E-Plane Arm of the Jerusalem Cross," *Electronics Letters,* vol. 18, No. 2, Jan. 21, 1982, pp. 94-95.

*Primary Examiner*—James W. Davie
*Attorney, Agent, or Firm*—Richard D. Laumann

[57] ABSTRACT

Frequency shift keying optical communications devices using a cleaved coupled cavity laser are described. The cleaved coupled cavity laser comprises first and second laser diode sections which are mutually optically coupled to each other and means for adjusting the refractive index of the first and second sections relative to each other. The cleaved coupled cavity laser is part of a light source which further comprises means for selecting at least one desired output frequency from a group of at least two output frequencies.

6 Claims, 4 Drawing Figures

OPTICAL COMMUNICATIONS SYSTEM USING FREQUENCY SHIFT KEYING

TECHNICAL FIELD

This invention relates generally to optical communications systems and particularly to such systems and components thereof using optical frequency shift keying.

BACKGROUND OF THE INVENTION

Many techniques, such as, for example, bandwidth compression, for increasing the information handling capabilities of communications systems exist. However, the desire for communications systems capable of transmitting even greater quantities of information in a given time period has almost inevitably led to the development of such systems capable of operating at ever higher frequencies. Communications systems using electromagnetic radiation were initially developed for operation at very low frequencies, less than 10 MHz, and the possibility of using electromagnetic radiation in the visible or near visible region has always been of interest because of the very high data rate transmission, relative to low frequency systems, possible in this short wavelength, high frequency region.

The lack of a suitable radiation source, which had long hindered developments in this area, was solved, at least in principle, with the invention of the laser, and the light source presently contemplated for most such systems is a semiconductor laser. Several transmission media are possible for use in communications systems operating in the visible or near visible region, but after the development of low loss glass transmission lines, commonly referred to as optical fibers, such optical fibers become the preferred transmission media. The optical fiber typically comprises a silica based glass having a high refractive index core surrounded by a low refractive index clad. The optical communications systems presently contemplated have a light source and photodetector optically coupled to each other by the optical fiber.

For transmission over extended distances, for example, more than 20 km, the optical signal is regenerated at one or more intermediate points by a device commonly referred to as a repeater. The repeater unit detects the incoming optical pulse and reshapes it into the desired electrical shape which is then applied to a laser. The repeater thus enables the system to operate over larger distances than are possible with a single fiber segment.

All optical fiber systems presently in commercial use are based on the encoding of the information by amplitude modulation (AM) and direct detection of the transmitted optical energy, i.e., they are two-level, one-channel systems. In other words, information is transmitted as an optical pulse is either transmitted or not transmitted within predetermined time intervals. However, more sophisticated schemes of encoding the transmitted information afford possibilities of either or both higher data transmission rates or longer repeater spacings than are possible with amplitude modulation. Multi-level and/or multi-channel systems should significantly increase the information transmission capacity of optical fiber communications systems. For example, optical frequency modulation (FM) might improve either the data transmission rate or permit the repeater spacings to be increased.

Although there has been interest recently in the modulation and demodulation of coherent laser radiation, the development of FM optical communications systems has been relatively slow. This is due to several factors including the absence of a laser that might be easily tuned through a suitable frequency range and the stringent requirements imposed upon the system by heterodyne detection. For example, the frequency shift keying (FSK) system described by Saito et al in *IEEE Journal of Quantum Electronics,* QE-17, pp. 935-941, June 1981, was a two-level, single-channel system using a continuously tuned laser and heterodyne detection. The frequency tuning rate is extremely small, approximately 100 MHz/mA, and limited to a tuning range of less than approximately 1 GHz.

However, the stringent requirements imposed on the system by heterodyne detection could be considerably relaxed if there were a laser easily tunable over a wide frequency width and which had a very narrow frequency output.

SUMMARY OF THE INVENTION

We have found that a device comprising a light source may be used for multi-level optical frequency shift keying when the light source comprises at least one cleaved coupled cavity semiconductor laser that may be optically coupled to an optical fiber, and means for varying the refractive index of at least one section of the laser relative to the other section to select one of at least two desired output frequencies. The system may further comprise a wavelength dispersive photodetector module which, together with the laser, comprises a repeater unit. The system may further comprise an optical fiber which optically couples the photodetector and light source. In one embodiment, a single laser is used and a four-level, two-channel frequency shift keying system is obtained.

Unlike prior art two-level frequency shift keying systems, the frequency shift of the cleaved coupled cavity laser is so large and the output so narrow in frequency that a direct detection scheme may be employed instead of heterodyne detection. This is desirable because it eliminates the use of an ultra-stable local oscillator.

For reasons of clarity, the elements of the invention are not drawn to scale in the FIGURES.

DETAILED DESCRIPTION

Figure 1:
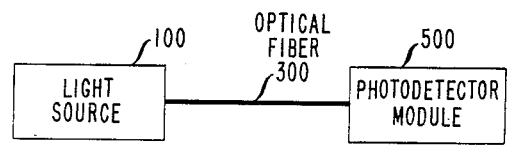
FIG. 1 is a schematic representation of a frequency shift keying optical communications system according to this invention.

A frequency shift keying optical communications system according to our invention is schematically depicted in FIG. 1. Depicted are a cleaved coupled cavity laser which is the light source 100, an optical fiber 300, and a wavelength dispersive photodetector module 500. The light source 100, which is tunable to at least two frequencies, and photodetector module 500 are optically coupled to each other by means of the optical fiber 300. The optical fiber may comprise any of the conventional and well-known silica-based optical fibers.

Figure 2:
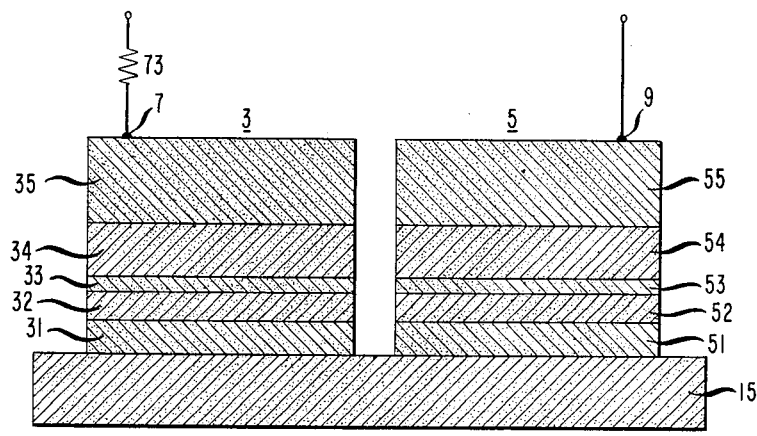
FIG. 2 is a cross-sectional view through the active layer of a cleaved coupled cavity semiconductor laser useful as the light source in the communications system depicted in FIG. 1.

A cross-sectional view of the cleaved coupled cavity laser of FIG. 1 through the active layers is shown in FIG. 2. Section 3 comprises a first layer 31, a first cladding layer 32, active layer 33, second cladding layer 34, and layer 35. Section 5 comprises first layer 51, first cladding layer 52, active layer 53, second cladding layer 54, and layer 55. Further, there is a built-in p-n junction in the active layer in each section. The active layer, i.e., the region in which electron-hole recombination occurs, has a first bandgap energy and a first refractive index. The active layers have a width through which current is injected that is less than 20 $\mu$m to prevent multifilament lasing, i.e., the active layers have a width less than 20 $\mu$m. The cladding layers have a second bandgap energy which is greater than the first bandgap energy and a second refractive index which is less than the first refractive index. The cladding layers thus provide both carrier and optical confinement for these index guided sections. Both sections 3 and 5 are disposed on substrate 15. Sections 3 and 5 are electrically contacted by electrodes 7 and 9, respectively, and there is further a circuit element, such as variable resistance 73, which permits the current through section 3 to be adjusted relative to the current of section 5. Variable resistance 73 thus provides means for adjusting the refractive index of the first and second sections relative to each other. The substrate 15 forms a common electrical contact to sections 3 and 5. The electrical contacts to sections 3 and 5 may also be used to adjust the current through the two sections. Although the active layers are depicted as being closer to the substrate than to the top surface, they may also be positioned the latter way, i.e., closer to the top surface. All the layers are epitaxially grown and are approximately lattice matched to each other. A variable resistance may also be connected to section 5. Further, laser heterostructures other than the one described may also be used and other means for adjusting the refractive index of the first and second sections relative to each other may also be used. Other index guided structures may also be used. Additionally, the layer structures in sections 3 and 5 may differ.

The cavities are mutually optically coupled to each other through cleaved mirror surfaces and the active stripes are aligned with respect to each other, i.e., the stripes are positioned essentially co-linearly with respect to each other, and separated by a relatively small distance, typically less than 10 $\mu$m, but greater than the carrier tunneling distance, thus providing electrical isolation between the sections. This, i.e., the carrier tunneling distance, is approximately 200 Angstroms for electrons in InGaAsP.

The sections should be electrically isolated from each other, i.e., they should be capable of being electrically biased relative to each other. This permits the carrier concentrations in the sections to be separately controllable.

The composition of the layers and substrate is not critical, although layers and substrate should be at least approximately lattice matched to each other, and may be selected from Group III-V and Group II-VI compound semiconductors. These compositions, for example, InGaAsP, permit the wavelength of the emitted radiation to be in those areas, 1.35 and 1.55 $\mu$m, presently of greatest interest for optical communications.

An exemplary method for forming devices comprising coupled cavities from a unitary structure according to this invention will be briefly described. A standard semiconductor laser wafer having a plurality of active stripes has, on one surface, a plurality of gold pads which are formed by, for example, electroplating. The precise structures of the active stripes and adjacent layers are not critical and they may be buried heterostructures, buried crescent heterostructures, or yet other types. The desired layers may be grown on the substrate by growth techniques, such as molecular beam or liquid phase epitaxy, that are well known to those skilled in the art. However, the isolated thick gold pads should preferably be approximately the same size as the standard diode and are electroplated onto the wafer side having the epitaxial layers, if the diode is CW bonded epitaxial layer (epilayer) side down, or onto the substrate side, if the diode is bonded epilayer side up. Other deposition techniques, such as evaporation, may also be used. Metals other than gold may be used if they adhere to the semiconductor and may be plastically deformed. Standard and well-known cleaving procedures are now applied. At one position, the bars separate from each other as these positions are not contacted by the gold pads. However, at the other positions, the presence of the gold pad holds the adjacent cleaved bars together. The lengths are not critical and can be selected as desired. The individual pairs of diodes, which are still held together by the gold pads, are now separated from each other by sawing or scribing. The resulting structure of a single pair of laser diode sections has two precisely self-aligned and extremely closely optically coupled Fabry-Perot cavities. The mirrors of the cavities are formed by the cleaved surfaces.

A typical separation of the coupled cavities is approximately 1 $\mu$m. If a larger separation is desired, it can be easily obtained by, for example, moving the two Fabry-Perot diodes with respect to each other using the gold pad as the hinge. The precise separation is not critical but it should be greater than the carrier tunneling distance and less than approximately 10 $\mu$m. Of course, the last movement should place the mirror faces parallel or approximately parallel to each other so that the active stripes are aligned with respect to each other. The mirror faces need not be precisely parallel to each other as the angular distribution of the emitted radiation is sufficiently broad to optically couple the cavities. However, the faces should not contact each other, as electrical isolation between the sections is desired. Further, the Fabry-Perot diodes may be slightly twisted with respect to each other with the active stripes forming the twist axis. This twist has a transverse mode filtering effect, i.e., certain transverse modes can be suppressed.

To complete the fabrication of the device, the two Fabry-Perot diodes hinged together by the gold pad are bonded, using, e.g., indium, simultaneously epilayer side down on a heat sink, such as gold plated copper. Standard CW bonding procedures may be employed. Separate electrical connections are made to each diode on the substrate side. Of course, if the gold pads are on the substrate side, the Fabry-Perot diodes are bonded simultaneously substrate side down, respectively, and the separate electrical connections are made on the epilayer side.

Use of the gold bonding pads is not essential. For example, the laser diode sections may be formed by cleaving a standard wafer without bonding pads and then positioning the diodes with respect to each other on the heat sink and bonding. However, the use of the gold pads facilitates relatively accurate positioning of the active stripes with respect to each other.

The wavelength dispersive photodetector module comprises at least one photodetector and a wavelength dispersive element. The module is thus capable of separate detection of the individual wavelengths. The wavelength dispersive element may be, for example, a grating, interferometer, etc., which diverts the separate wavelengths into different individual photodetectors, within the module, in which the optical pulses are absorbed and corresponding output voltage or current pulses produced at the different individual detectors responsible for detecting the different wavelengths.

Figure 3:
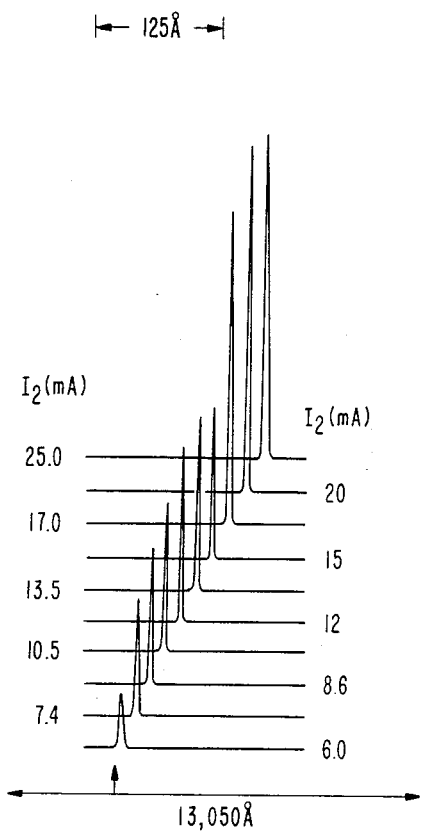
FIG. 3 shows the frequency tuning of the cleaved coupled cavity laser with the wavelength being plotted horizontally and the output intensity being plotted vertically with the current through the modulating diode being indicated on the individual spectra.

The cleaved coupled cavity laser is operated as follows in a frequency shift keying communications system. One of the diode sections of the cleaved coupled cavity laser operates as a laser and the second diode section operates under lasing threshold as a frequency modulator. A change in the current applied to the modulator diode produces a change in the carrier density which, in turn, produces a corresponding change in the effective refractive index of cavity. The change in the effective refractive index of the cavity results in a slight shift of the Fabry-Perot modes of the modulator with respect to those of the laser diode. Such a slight shift results, because of the optical coupling between the two cavities, in a large shift, typically 15 Angstroms, of the enforced mode of the coupled cavity to the adjacent Fabry-Perot mode of the laser diode section. FIG. 3 shows various spectra obtained with different current levels applied to the modulator diode section. The laser was an InGaAsP buried crescent laser such as those described in *Electronics Letters*, 18, pp. 95–96, 1982. The wavelength is plotted horizontally and the output intensity is plotted vertically. The current through the modulator section is indicated on each spectrum. As is evident, a frequency shift of 150 Angstroms can be obtained. As is also evident, a frequency tuning rate of 10 Angstroms/mA can also be obtained. Such a large tuning range and tuning rate permit fabrication of a multichannel, multilevel frequency shift keying transmission system. As the current through the modulator section is varied, the frequency of the emitted radiation is also varied. Thus, the means for varying the current through the modulator section comprises means for selecting a desired output frequency from a group of at least two output frequencies. Such frequency shifting can be achieved in less than 1 nanosecond implying that bit rates greater than 1 Gigabit/second can be achieved. It should also be noted that the cleaved coupled cavity laser operates with a single longitudinal mode even under high speed modulation. That is, the ratio of the most intense longitudinal mode relative to suppressed longitudinal modes is at least 50 when the laser is CW operated.

The operation of a two-channel, four-level frequency shift keying system will be better understood by reference to a specific example. Electrical pulses from two channels, A and B, either alone or multiplexed (A+B), may be applied to the modulator diode. The current pulses for channels A and B are of different magnitude. The laser diode has a dc current applied. Because the output lasing wavelength is a function of the current applied to the modulator section of the cleaved coupled cavity laser, the three different current levels that result from multiplexing channels A and B will yield output lasing modes at three different wavelengths. The fourth wavelength is obtained when neither channel A nor B has a pulse. The TABLE shows the coding and decoding scheme of a four-level two-channel optical frequency shift keying system according to our invention.

TABLE

| CHANNEL | | |
|---|---|---|
| A | B | Λ |
| CODING | | |
| 0 | 0 | $\lambda_0$ |
| 1 | 0 | $\lambda_1$ |
| 0 | 1 | $\lambda_2$ |
| 1 | 1 | $\lambda_3$ |
| DECODING | | |
| A = $\lambda_1 + \lambda_3$ | | |
| B = $\lambda_2 + \lambda_3$ | | |

Figure 4:
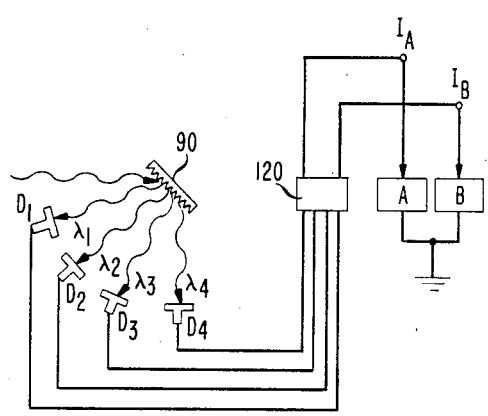
FIG. 4 is a representation of a repeater unit useful in the system depicted in FIG. 1.

FIG. 4 depicts a repeater unit useful in the optical frequency shift keying communications system of this invention. The repeater unit comprises a wavelength dispersive element 90, which receives the optical pulse from the previous laser, signal regenerating means 120 and a cleaved coupled cavity laser. The wavelength dispersive element 90, for example, a grating, directs the separate wavelengths, $\lambda_1$, $\lambda_2$, $\lambda_3$, and $\lambda_4$ into the individual photodetectors $D_1$, $D_2$, $D_3$, and $D_4$, respectively. Means 120 receives electrical signals from a plurality of individual photodetectors $D_1$, $D_2$, $D_3$, and $D_4$ and regenerates the electrical current pulses in a manner well known to those skilled in the art. These pulses are then applied to the cleaved coupled cavity laser to produce output at the desired wavelength.

It will be apparent to those skilled in the art that, for example, an eight-level, three-channel frequency shift keying system can also be constructed in a similar manner. Other modifications are contemplated. For example, the laser and photodetector may be optically coupled through air or free space.

What is claimed is:

1. A device comprising a light source, characterized in that said light source comprises a cleaved coupled cavity laser, said laser comprising
   a first semiconductor laser diode section, said first section having a first active layer;
   a second semiconductor laser diode section, said second section having a second active layer, said first and second active layers having a width less than approximately 20 μm;
   said first and second sections being optically coupled in both directions through spaced cleaved surfaces;
   means for adjusting the refractive index of said first and second sections relative to each other;
   and means for selecting one desired output frequency from a group of at least two output frequencies.

2. A device as recited in claim 1 in which said means for selecting comprises means for adjusting the current through said second section of said cleaved coupled cavity laser.

3. A device as recited in claim 2 further comprising a wavelength dispersive photodetector module, said photodetector module being optically connected to said cleaved coupled cavity laser.

4. A device as recited in claim 3 in which said photodetector module comprises a wavelength dispersive element and at least one photodetector generating current pulses.

5. A device as recited in claim 4 further comprising means for regenerating current pulses from said at least one photodetector, said means for regenerating being connected to said module and said laser.

6. A device as recited in claim 5 in which said module comprises a plurality of photodetectors.

* * * * *